(12) United States Patent
Cheng et al.

(10) Patent No.: US 7,876,116 B1
(45) Date of Patent: Jan. 25, 2011

(54) COMPLIANT CHUCK FOR SEMICONDUCTING DEVICE TESTING AND CHILLER THEREOF

(75) Inventors: Huang-Sheng Cheng, Kaohsiung (TW); Cheng-Jung Tsai, Kaohsiung (TW)

(73) Assignee: Win Way Technology Co., Ltd., Kaohsiung (TW)

( * ) Notice: Subject to any disclaimer, the term of this patent is extended or adjusted under 35 U.S.C. 154(b) by 0 days.

(21) Appl. No.: 12/568,785

(22) Filed: Sep. 29, 2009

(51) Int. Cl.
*G01R 31/02* (2006.01)
(52) U.S. Cl. .................. 324/755; 324/765; 324/158.1
(58) Field of Classification Search .............. None
See application file for complete search history.

(56) References Cited

U.S. PATENT DOCUMENTS 6,162,066 A * 12/2000 Glick et al. ................ 439/73
6,873,169 B1 * 3/2005 Ham et al. ................. 324/755
2005/0231919 A1 * 10/2005 Ujike et al. ................ 361/719

* cited by examiner

*Primary Examiner*—Ha Tran T Nguyen
*Assistant Examiner*—Arleen M Vazquez
(74) *Attorney, Agent, or Firm*—The Weintraub Group, P.L.C.

(57) ABSTRACT

A compliant chuck has a top base assembly, a bottom bracket assembly, a contact plate, a sensor device, a thermoelectric cooling module and a heat-dissipating module. The bottom bracket assembly has a center opening. The contact plate is disposed between the top base assembly and the bottom bracket assembly and has a protrusion corresponding to the center opening and having a mounting hole and an adsorbing hole. The sensor device is mounted in the mounting hole. The thermoelectric cooling module is attached to a top surface of the contact plate. The heat-dissipating module is mounted on the thermoelectric cooling module and cooperates with a chiller to dissipate heat. The compliant chuck uses the sensor device to sense surface temperature of a semiconducting device during testing the semiconducting device so as to compensate the temperature by controlling current into the thermoelectric cooling module.

8 Claims, 10 Drawing Sheets

US 7,876,116 B1

COMPLIANT CHUCK FOR SEMICONDUCTING DEVICE TESTING AND CHILLER THEREOF

BACKGROUND OF THE INVENTION

1. Field of the Invention

The present invention relates to a semiconducting device testing apparatus, especially to a compliant chuck for semiconducting device testing and a chiller thereof.

2. Description of the Related Art

After fabrication of semiconducting devices, manufacturers usually execute a parametric testing process to find malfunctioned ones. In view of the semiconducting devices usually operated in a high temperature environment, the manufacturers design a high temperature condition to perform an aging test when performing circuit testing to the semiconducting device. Therefore the semiconducting device can ensure a stability and long life after being put into practical use in the future.

With reference to FIG. 10, a conventional adsorbing device (80) used in semiconducting device testing has a sucking end (81) on a bottom. The sucking end (81) is for holding a semiconducting device (800) by vacuum adsorption.

A top of the adsorbing device (80) is connected to a robot arm and driven by the robot arm to move and put the semiconducting device (800) on a testing socket. The adsorbing device (80) do not have heating capability, in order to provide a high temperature testing environment, a heater (82) is further mounted above the top of the adsorbing device (80) and is used to heat the adsorbing device (80). Through heat conduction, the adsorbing device (80) then provides the semiconducting device (800) a high temperature testing environment.

However, during circuit testing, the semiconducting device (800) electrically connected to the testing socket may generate additional heat that makes the temperature around the semiconducting device (800) differ from a predetermined temperature set by a testing system. Since the adsorbing device (80) cannot automatically detect the temperature of the semiconducting device (800), the testing system cannot adjust output power of the heater (82) to achieve temperature compensation and maintain the same testing temperature condition. Besides, because the heater (82) is at a certain distance from the semiconducting device (800) and both the heater (82) and the adsorbing device (80) are in open space, some heat may be dissipated from the adsorbing device (80) when not yet being conducted to the semiconducting device (800). Therefore, the temperature condition provided by the testing system with the heater (82) has certain inaccuracy due to the aforementioned concerns.

Furthermore, with reference to FIG. 11, in order to quickly lower the temperature of the adsorbing device (80) and achieve the goal of temperature compensation, manufacturer uses a chiller (90) to dissipate heat of the adsorbing device (80). The adsorbing device (80) further has a chamber formed inside the adsorbing device (80) and two pipe ends (83) communicating with the chamber. The chiller (90) has a water tank (91) and a pump (92) connected to the water tank (91). The pump (92) has an inlet (920) and outlet (921) respectively connected to the pipe ends (83) of the adsorbing device (80) via two pipes (93). The pump (92) drives water from the water tank (91) to the outlet (921). The flowing water is guided to the chamber of the adsorbing device (80) via the pipe (93) and lowers the temperature of the heated adsorbing device (80). The pump (92) may further draw the water in the chamber back to the water tank (91) through the inlet (920). By such water circulatory system, the adsorbing device (80) can be quickly cooled.

However, once one pipe (93) is broken, the pump (92) that continues draining or draining/drawing the water will cause the pipe (93) unceasingly leak and increase the damaged possibility of electronic components around the adsorbing device (80).

To overcome the shortcomings, the present invention provides a compliant chuck for semiconducting device testing and a chiller thereof in order to mitigate or obviate the aforementioned problems.

SUMMARY OF THE INVENTION

The main objective of the present invention is to provide a compliant chuck that senses the surface temperature of a semiconducting device and timely performs temperature compensation accordingly during testing.

The compliant chuck in accordance with the present invention comprises a top base assembly, a bottom bracket assembly, a contact plate, a sensor device, a thermoelectric cooling module and a heat-dissipating module.

The top base assembly has a base body with a center hole formed through a top surface of the base body. The bottom bracket assembly is attached to the top base assembly and has a bracket body having a center opening formed through a center of the bracket body. The contact plate is disposed between the base body and the bracket body, mounted on the bracket body and has a protrusion formed on and protruding from a bottom of the contact plate, corresponding to the center opening of the contact plate and having a mounting hole and an adsorbing hole. The mounting hole and the adsorbing hole are respectively formed through a bottom surface of the protrusion. The sensor device has a sensing body disposed in the mounting hole and partially extending out from the mounting hole. The thermoelectric cooling module is clamped between the base body and the contact plate, attached to a top surface of the contact plate with a bottom side. The heat-dissipating module is clamped between the thermoelectric cooling module and the base body and has a heat exchanging body having a channel and two faucets respectively connected to two ends of the channel.

The compliant chuck uses the sensor device to sense surface temperature of the semiconducting device and automatically compensates the temperature by controlling the thermoelectric cooling module to maintain a predetermined temperature condition for the semiconducting device.

Another objective of the present invention is to provide a chiller for the aforementioned compliant chuck.

The chiller comprises two pipes and a cooling device. The pipes respectively have a first end and a second end. The first end is connected to a corresponding faucet of the heat exchanging body. The cooling device has a water tank and a pump. The water tank stores cooling water and has an outlet connected to the second end of one of the pipes. The pump is connected to the water tank and has an inlet connected to the second end of the other one of the pipes. exerts a suction force, with a negative pressure, in the pipes (700) from the inlet A water flow cycle starts due to a negative pressure generated by the suction of the pump. Once one of the pipes is broken and has a flaw, the suction force of the pump no longer forms negative pressure to the cooling water in a farther end next to the flaw of the pipe. The water flow cycle then automatically stops and prevents continuous water leak. Therefore, a possibility of the leaking water damaging the electronic components around the compliant chuck can be reduced.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
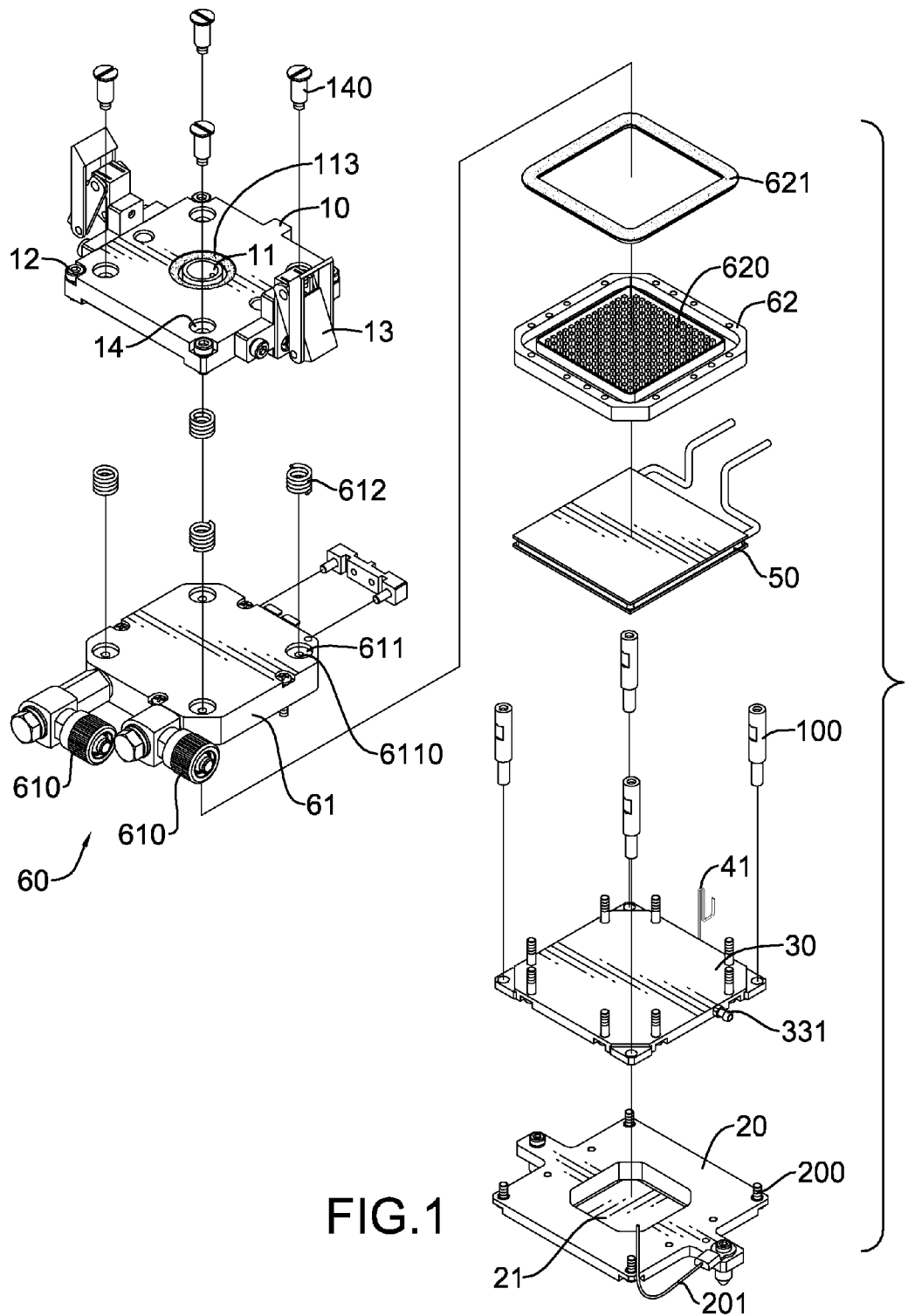
FIG. 1 is an exploded perspective view of a compliant chuck in accordance with the present invention.
Figure 2:
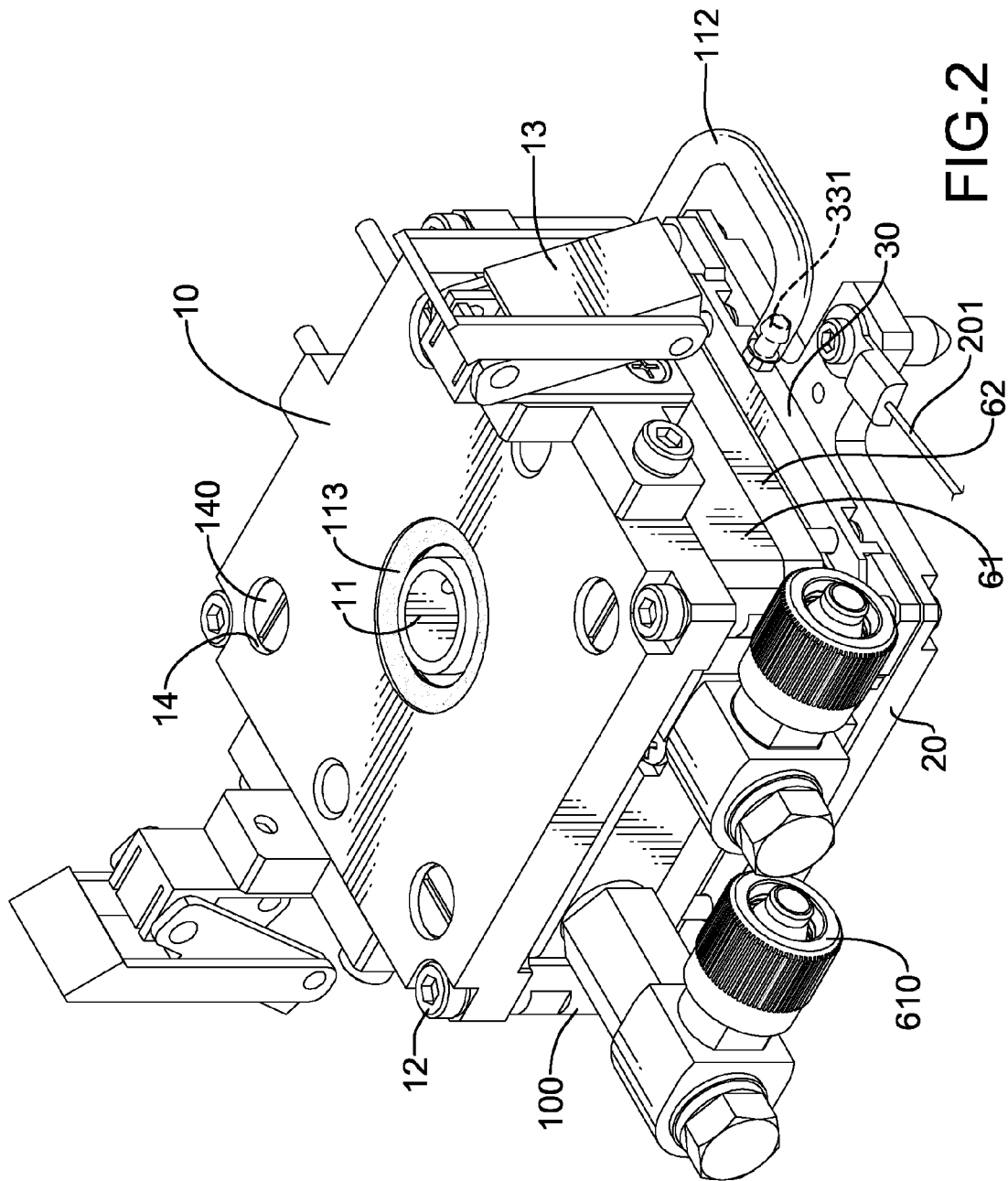
FIG. 2 is an assembled perspective view of a compliant chuck in accordance with the present invention.
Figure 3:
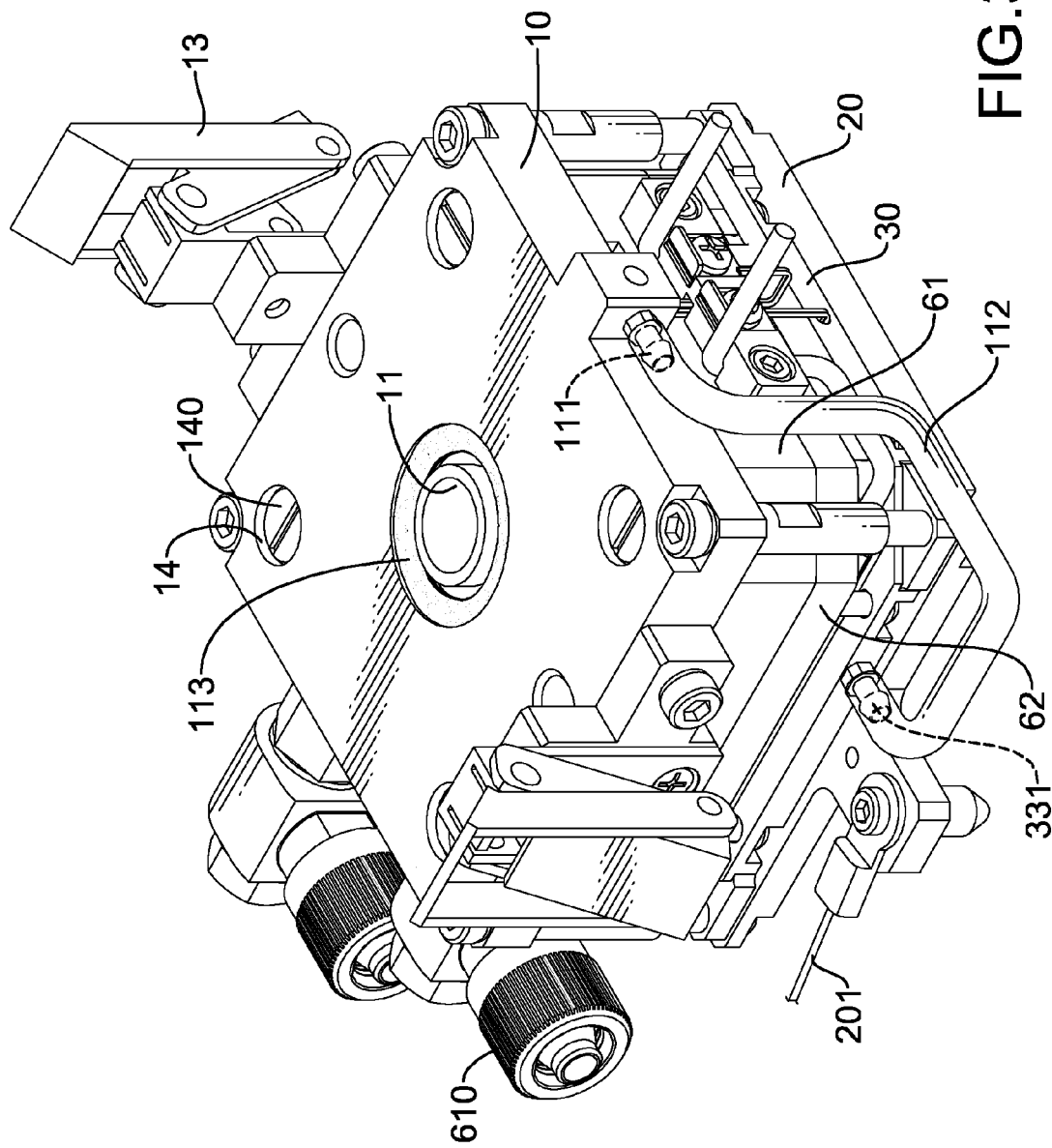
FIG. 3 is another perspective view of the compliant chuck in FIG. 2.

With reference to FIGS. 1 to 4, a compliant chuck for semiconducting device testing comprises a top base assembly, a bottom bracket assembly, a contact plate (30), a sensor device (40), a thermoelectric cooling module (50) and a heat-dissipating module (60).

The top base assembly has a base body (10), multiple first screws (12), two fasteners (13), multiple second screws (140) and a first O-shaped ring (113). The base body (10) has a center hole (11), a first tube hole and multiple through holes (14). The center hole (11) is formed through a top surface of the base body (10) and adapted to connect to a vacuum tube. The first tube hole is formed through a side surface of the base body (10), communicates with the center hole (11) in the base body (10) and connects to a first faucet (111). The first faucet (111) is connected to an end of a tube (112). The through holes (14) are formed through the base body (10) respectively close to four corners of the base body (10). The first screws (12) are respectively mounted through the corners of the base body (10) near the through holes (14) and each screw (12) is connected to a top end of a shaft (100). The fasteners (13) are respectively mounted on two opposite sides of the top base (10) for connecting to a robot arm of a testing system. The second screws (140) are mounted through the through holes (14) of the base body (10). The first O-shaped ring (113) is mounted around the center hole (11) of the base body (10).

Figure 7:
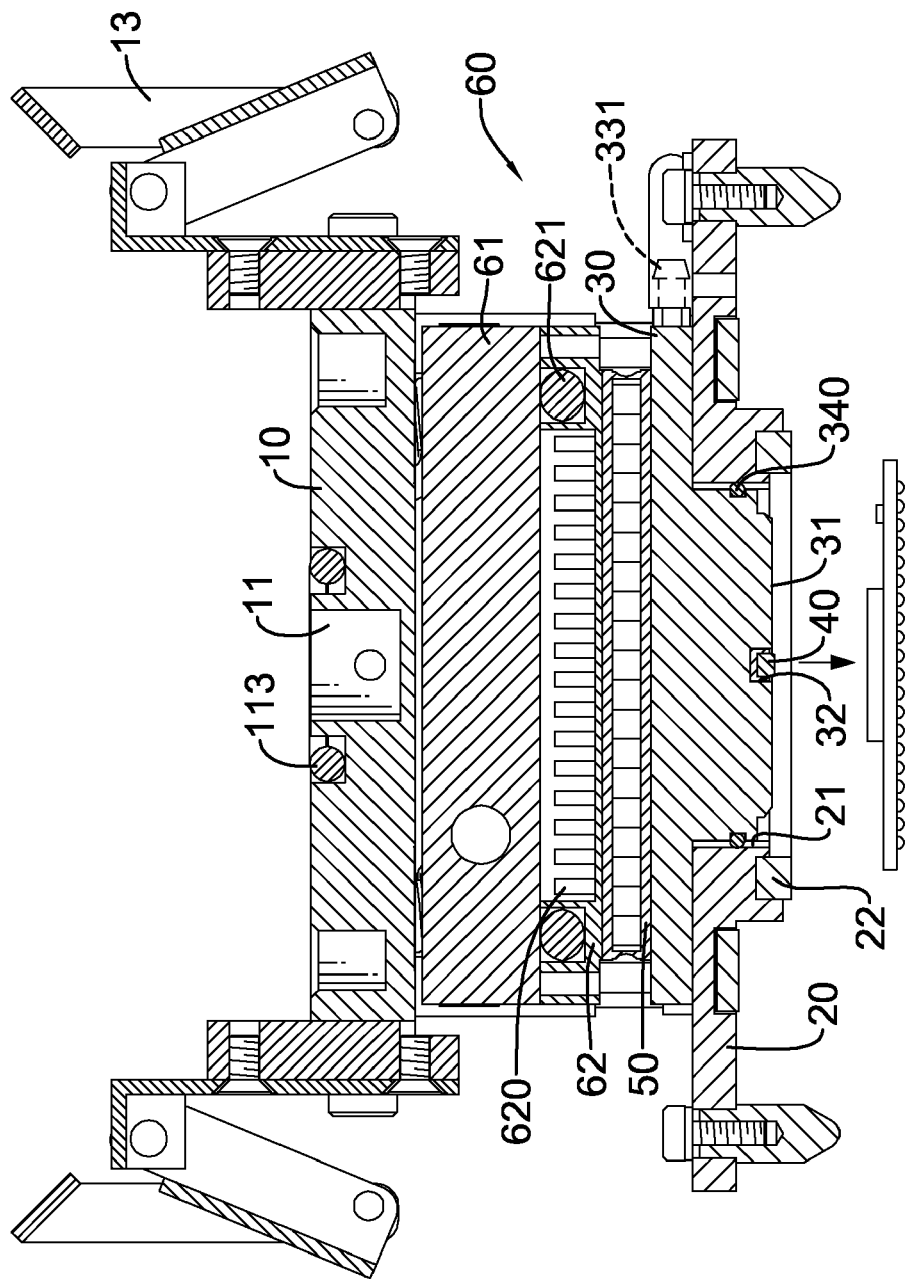
FIG. 7 is a cross sectional side view of the compliant chuck in FIG. 2.

The bottom bracket assembly is attached to the top base assembly and has a bracket body (20), multiple third screws (200) and a ground wire (201). The bracket body (20) has a center opening (21). The center opening (21) is formed through a center of the bracket body (20) and may be square. The third screws (200) is mounted through four corners of bracket body (20) and each third screw (200) is connected to a bottom end of a corresponding connecting shaft (100) to connect the base body (10) and the bracket body (20). With the lengths of the connecting shafts (100), the connecting shafts (100) provide a space for mounting other components between the base body (10) and the bottom bracket (20). The ground wire (201) is attached to a side of the bracket body (20). With further reference to FIG. 7, the bottom bracket assembly (20) further has a washer (22) mounted on the bracket body (20) around the center opening (21). The washer (22) is an elastomer made from porous silica materials and has a coating of electrostatic discharge protection formed on a surface of the washer (22).

Figure 4:
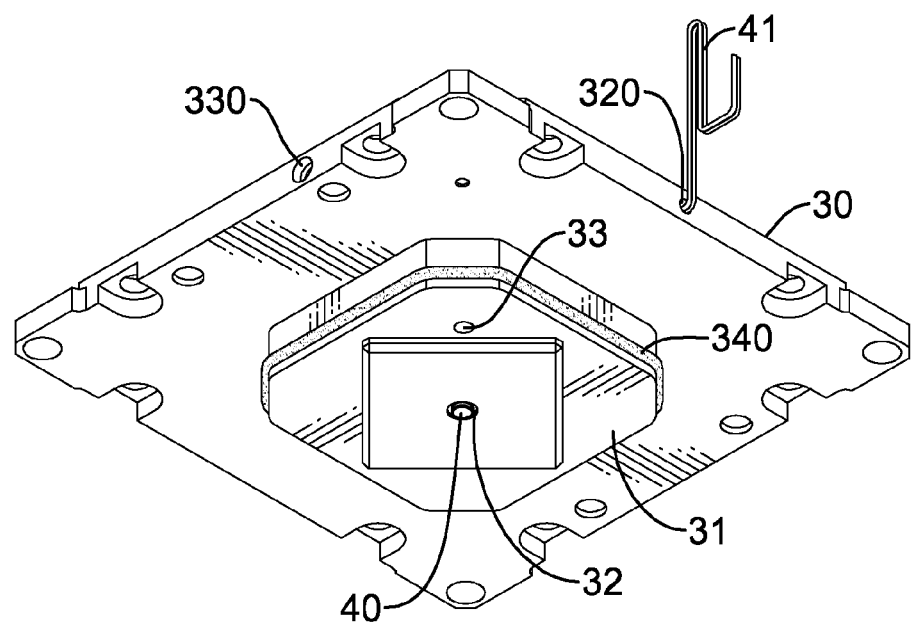
FIG. 4 is a perspective view of a contact base of the compliant chuck in FIG. 1.

The contact plate (30) shown in FIG. 4 is disposed between the base body (10) and the bracket body (20) and mounted on the bracket body (20). The contact plate (30) has a protrusion (31), a wire hole (320) and a second tube hole (330).

The protrusion (31) is formed on and protrudes from a bottom of the contact plate (30), corresponds to the center opening (21) and has a mounting hole (32), an adsorbing hole (33) and a side groove (34). The mounting hole (32) is formed through a bottom surface of the protrusion (31). The adsorbing hole (33) is formed through the bottom surface of the protrusion (31). The side groove (34) is formed on a sidewall of the protrusion (31) and may receive a second O-shaped ring (340). The wire hole (320) is formed on a side of the contact plate (30), extends into the contact plate (30) and communicates with the mounting hole (32) of the protrusion (31). The second tube hole (330) is formed on a side of the contact plate (30), extends into the contact plate (30), communicates with the adsorbing hole (33), and connects to a second faucet (331). The second faucet (331) is connected to another end of the tube (112). With the first tube hole, the second tube hole (330) and the tube (112), the adsorbing hole (33) of the protrusion (31) of the contact plate (30) communicates with the center hole (11) of the base body (10).

Therefore, when the protrusion (31) contacts with a surface of a semiconducting device, the vacuum tube that connects to the center hole (11) can thereby generate a vacuum suction force to the adsorbing hole (33) of the protrusion (31) and adsorb the semiconducting device. As shown in FIG. 7, the second O-shaped ring (340) on the side groove (34) of the protrusion (31) can seal a gap between the protrusion (31) and the center opening (21) of the bracket body (20) of the bottom bracket. In the meantime, the washer (22) can be attached to an edge of the semiconducting device to prevent external air from entering and thereby cooperate with the second O-shaped ring (340) to form a vacuum room to achieve device adsorption.

Figure 5:
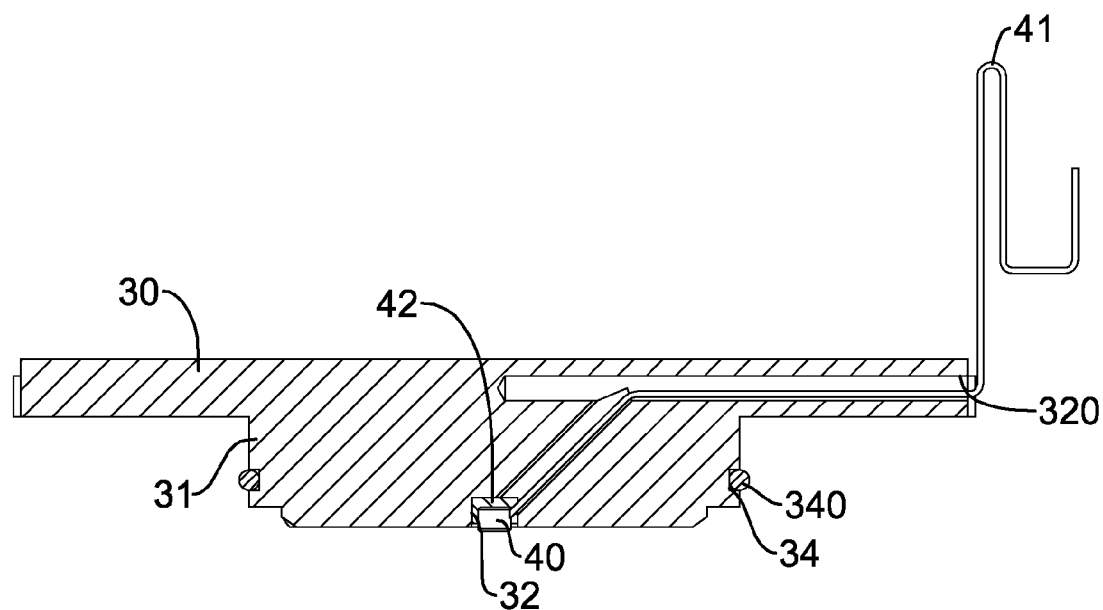
FIG. 5 is a cross sectional side view of the contact base in FIG. 4.

With further reference to FIG. 5, the sensor device (40) is mounted in the mounting hole (32) of the contact plate (30) and has a sensing body, a cushion (42) and a wire (41). The sensing body of the sensor device (40) is disposed in the mounting hole (32) and partially extends out from the mounting hole (32). The cushion (42) holds the sensing body and fills the mounting hole (32) to prevent air from entering the vacuum room and provide a buffer when the sensing body is against the semiconducting device. The wire (41) is connected to the sensing body, extends into the contact plate (30) through the wire hole (320) of the contact plate (30) and is connected to a controller of the aforementioned testing system.

The thermoelectric cooling module (50) is clamped between the base body (10) and the contact plate (30), attached to a top surface of the contact plate (30) with a bottom side and is made by mounting multiple N-type and P-type thermoelectric semiconductor elements between two ceramic sheets. When the thermoelectric cooling module (50) is powered by DC current, the thermoelectric cooling module (50) will has a top side or a bottom side performing heat radiation and another side performing heat absorption. Both functions of the top and bottom sides can be exchanged by controlling direction of the DC current. Hence the thermoelectric cooling module (50) can heat or cool the contact plate (30) by current control.

Figure 6:
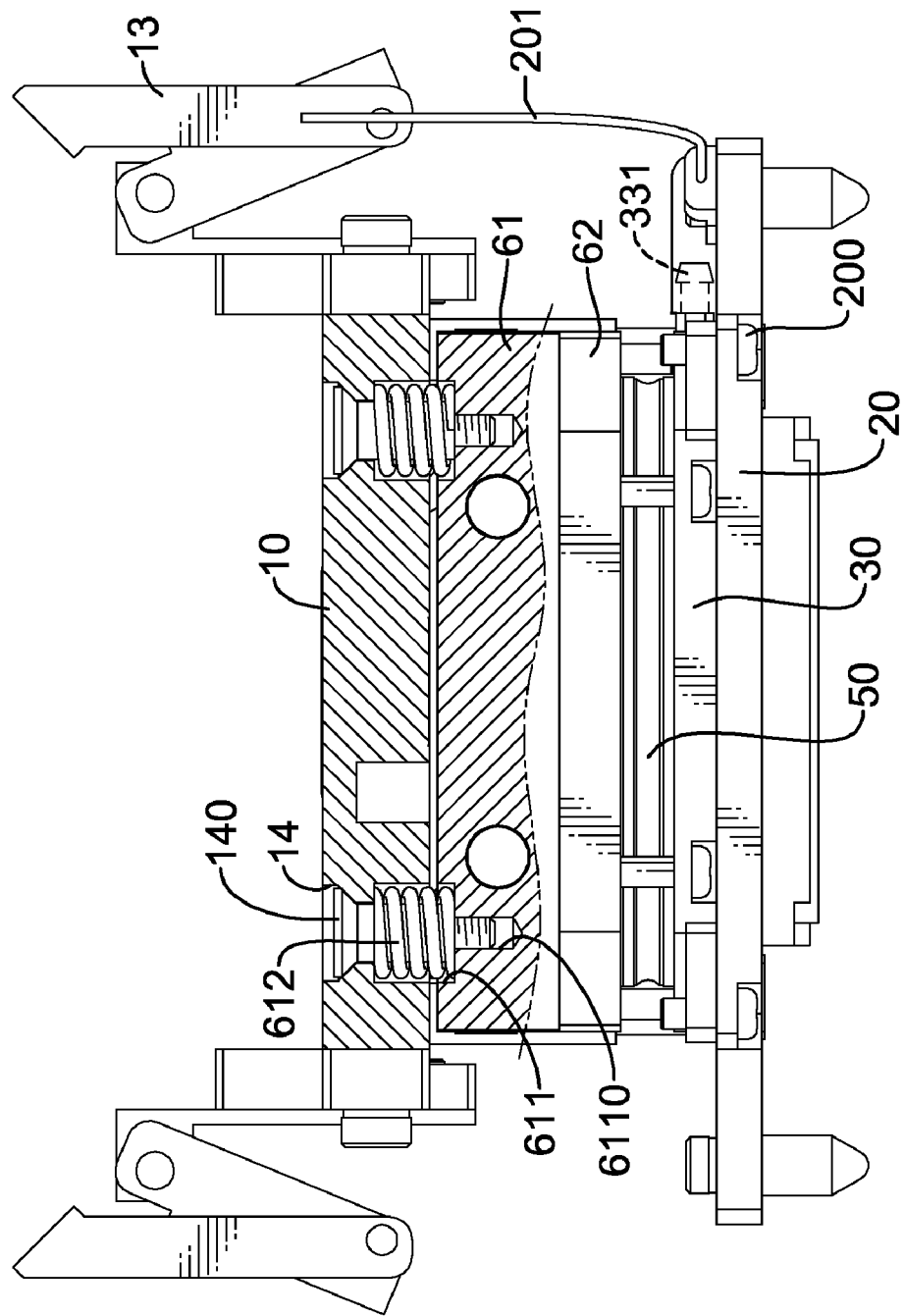
FIG. 6 is a side view in partial section of the compliant chuck in FIG. 2.

The heat-dissipating module (60) is clamped between the thermoelectric cooling module (50) and the base body (10) and has a heat exchanging body (61), multiple springs (612), a heat dissipating plate (62) and a third O-shaped ring (621). The heat exchanging body (61) has a channel, two faucets (610) and four recesses (611). The channel is formed inside the heat exchanging body (61). The faucets (610) are respectively connected to two ends of the channel. The recesses (611) are respectively formed on four corners of a top surface of the heat exchanging body (61), correspond to the through holes (14) of the base body (10) and each recess (611) has a fastening hole (6110). Each second screw (140) that is mounted through a corresponding through hole (14) of the base body (10) further extends into the fastening hole (6110) of a corresponding recess (611) of the heat exchanging body (61). With further reference to FIG. 6, the springs (612) are respectively mounted in the recesses (611) and each spring (612) surrounds a corresponding second screw (140). The heat dissipating plate (62) is made of metal, attached to the top side of the thermoelectric cooling module (50) and has multiple posts (620) arranged in a group for increasing heat dissipating surface area. The third O-shaped ring (621) is mounted around the group of the posts (620).

For circuit testing, an untested semiconducting device is adsorbed by the protrusion (31) of the contact plate (30) through vacuum suction and moved to a testing socket. If the compliant chuck exerts too much pressure on the semiconducting device, the springs (612) between the base body (10) and the heat exchanging body (61) can provide a buffer for the contact plate (30) not to damage the semiconducting device and also ensure proper contact force.

As performing circuit testing, the testing system controls the thermoelectric cooling module (50) to selectively heat or cool the contact plate (30), the contact plate (30) therefore provide the semiconducting device a high or low temperature environment. Meanwhile, the sensor device (40) on the bottom surface of the protrusion (31) of the contact plate (30) continuously senses the surface temperature of the semiconducting device and accordingly returns a signal to the testing system. Once the temperature changes during the circuit testing, the testing system can immediately sense the temperature variation compared with a predetermined temperature and accordingly adjust the current that controls the thermoelectric cooling module (50) to compensate the temperature associated with the predetermined one. Hence the surface temperature of the semiconducting device can be maintained within a small variation range of predetermined temperature.

Figure 8:
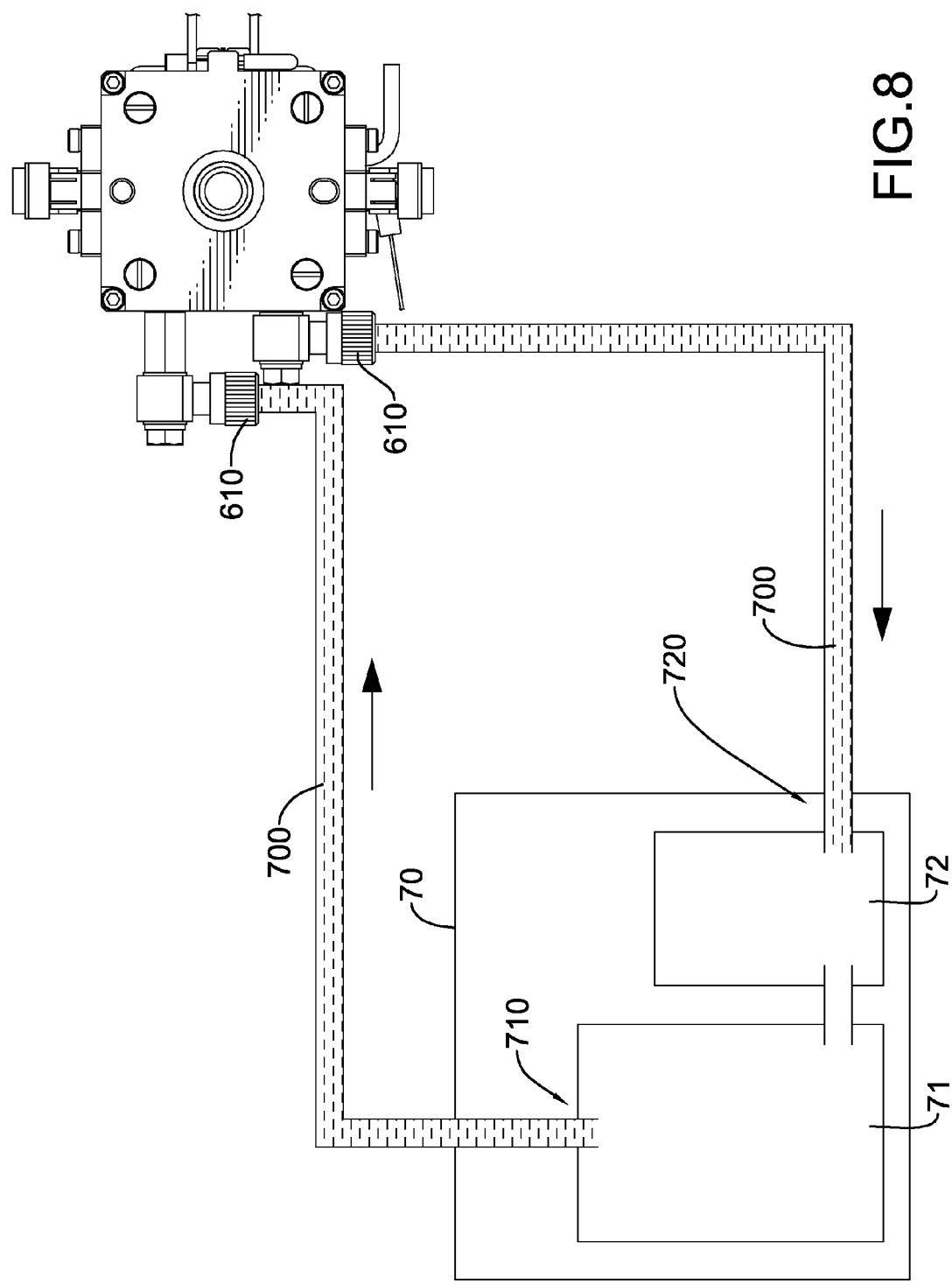
FIG. 8 is a plain view of a chiller connected to a compliant chuck in accordance with the present invention.

With further reference to FIG. 8, the heat exchanging body (61) of the heat-dissipating module (60) is connected to a chiller. The chiller comprises two pipes (700) and a cooling device (70).

The pipes (700) respectively have a first end and a second end. The first ends of the pipes (700) are respectively connected to the faucets (610) of the heat exchanging body (61).

The cooling device (70) has a water tank (71) and a pump (72). The water tank (71) stores cooling water and has an outlet (710) connected to the second end of one of the pipes (700). The pump (72) is connected to the water tank (71) and has an inlet (720) connected to the second end of the other one of the pipes (700). The pump (72) exerts a suction force, with a negative pressure, in the pipes (700) from the inlet (720) to suck the cooling water from the water tank (71) via the outlet (710). The cooling water flows through the pipe (700) connected to the water tank (71), the channel of the heat exchanging body (61), the other pipe (700) and the pump (72) in order and returns to the water tank (71). Therefore a cycle of water flow in a negative pressure chiller system is formed to take away the heat of the heat exchanging body (61).

Figure 9:
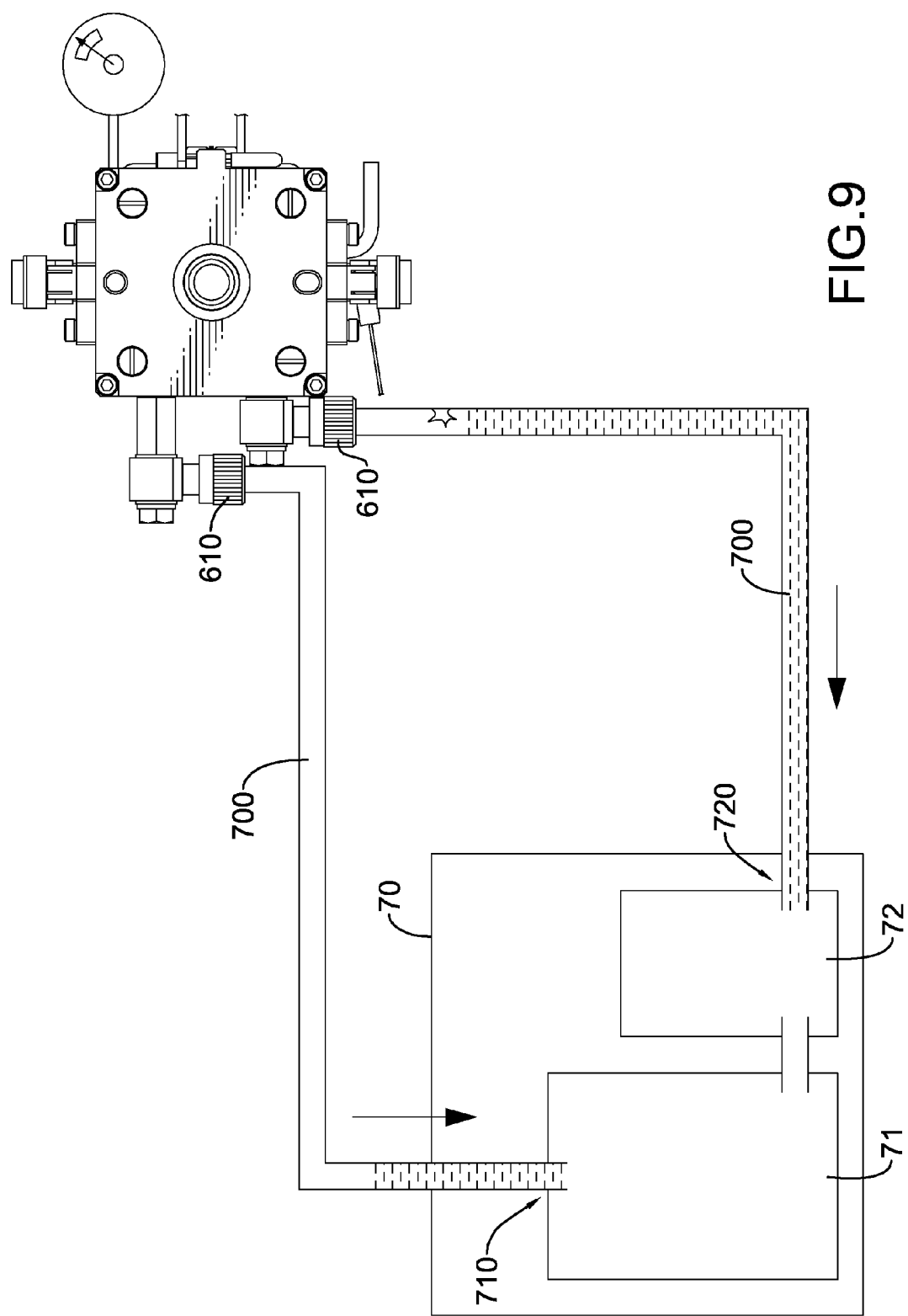
FIG. 9 is a plain view of the chiller connected to the compliant chuck in FIG. 8, showing flow of water when a pipe is broken.
Figure 10:
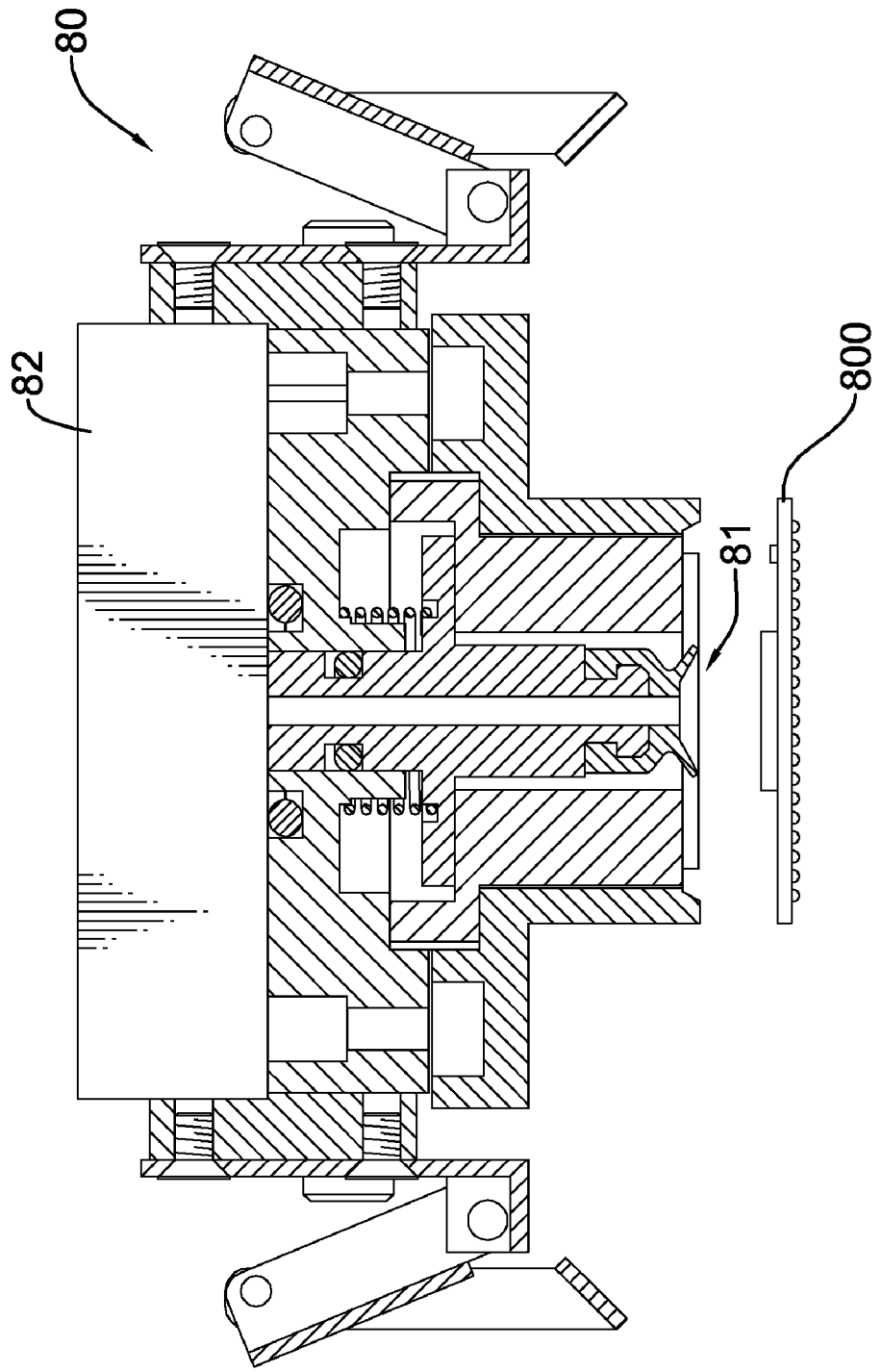
FIG. 10 is a cross sectional side view of a conventional adsorbing device.
Figure 11:
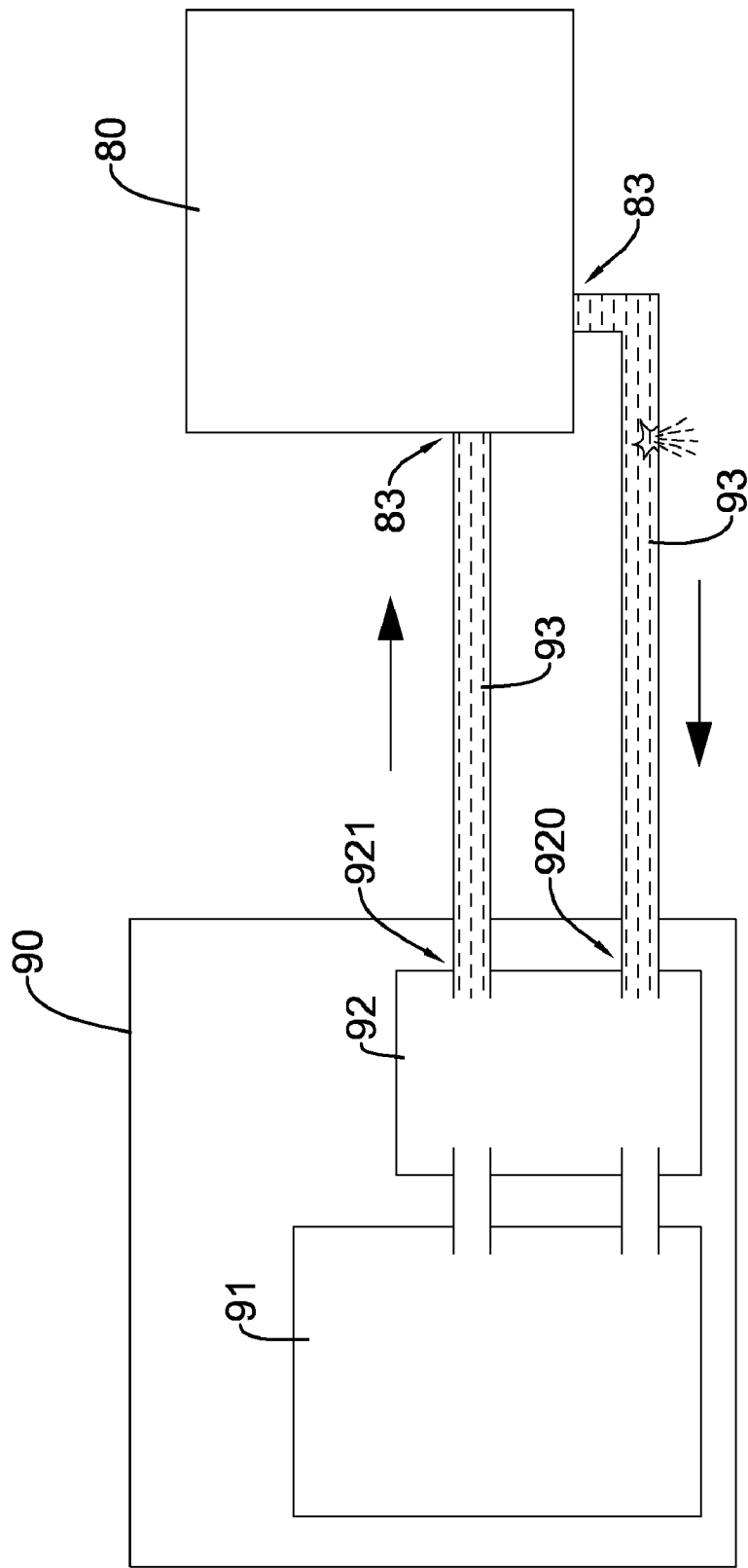
FIG. 11 is a plain view of a chiller connected to the conventional adsorbing device in FIG. 10 to perform heat dissipation.

With further reference to FIG. 9, since the water flows due to a negative pressure generated by the suction of the pump (72), once one pipe (700) is broken and has a flaw and the inner pressure in the pipe (700) thereby becomes the same with the atmospheric pressure, the suction force of the pump (72) no longer forms negative pressure to the cooling water in a farther end next to the flaw of the pipe (700). The water flow cycle then stops to prevent cooling water from continuously leaking and thereby reduce the damaging possibility of electronic components around the compliant chuck. Besides, once the water flow stops and the compliant chuck cannot dissipate heat, the compliant chuck and the pump (72) can be set to stop working for protection from overheated when the temperature reaches a critical temperature.

The compliant chuck of the present invention uses the sensor device (40) to sense the surface temperature of the semiconducting device and automatically compensate the temperature by controlling the thermoelectric cooling module (50) to maintain a predetermined temperature condition for the semiconducting device. Besides, the thermoelectric cooling module (50) further provides a low temperature testing environment to more ensure quality of the semiconducting device. Furthermore, the negative pressure chiller cooperating with the compliant chuck can prevent continuous water leak.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A compliant chuck for semiconducting device testing comprising:
   a top base assembly having a base body having
      a center hole formed through a top surface of the base body; and
      a first tube hole formed through a side surface of the base body and communicating with the center hole in the base body;
   a bottom bracket assembly attached to the top base assembly and having
      a bracket body having a center opening formed through a center of the bracket body;
   a contact plate disposed between the base body and the bracket body, mounted on the bracket body and having
      a protrusion formed on and protruding from a bottom of the contact plate, corresponding to the center opening of the contact plate and having
         a mounting hole formed through a bottom surface of the protrusion; and
         an adsorbing hole formed through a bottom surface of the protrusion; and a second tube hole formed on a side of the contact plate, extending into the contact plate and communicating with the adsorbing hole of the protrusion;

a sensor device mounted in the mounting hole of the protrusion of the contact plate and having a sensing body disposed in the mounting hole and partially extending out from the mounting hole;

a thermoelectric cooling module clamped between the base body and the contact plate, attached to a top surface of the contact plate with a bottom side; and a heat-dissipating module clamped between the thermoelectric cooling module and the base body and having a heat exchanging body having
a channel formed inside the heat exchanging body; and
two faucets respectively connected to two ends of the channel.

2. The compliant chuck as claimed in claim 1, wherein
the contact plate further has a wire hole formed on a side of the contact plate, extending into the contact plate and communicating with the mounting hole of the protrusion; and the sensor device further has a wire connected to the sensing body, extending inside the contact plate through the wire hole of the contact plate.

3. The compliant chuck as claimed in claim 1, wherein
the base body of the top base assembly further has multiple through holes formed through the base body respectively close to four corners of the base body;

the heat exchanging body further has four recesses respectively formed on four corners of a top surface of the heat exchanging body, corresponding to the through holes of the base body and each recess having a fastening hole;

the top base assembly further has multiple second screws mounted through the through holes of the base body and each second screw extending into the fastening hole of a corresponding recess of the heat exchanging body; and the heat-dissipating module further has multiple springs respectively mounted in the recesses and each spring surrounding a corresponding second screw.

4. The compliant chuck as claimed in claim 2, wherein
the base body of the top base assembly further has multiple through holes formed through the base body respectively close to four corners of the base body;

the heat exchanging body further has four recesses respectively formed on four corners of a top surface of the heat exchanging body, corresponding to the through holes of the base body and each recess having a fastening hole;

the top base assembly further has multiple second screws mounted through the through holes of the base body and each second screw extending into the fastening hole of a corresponding recess of the heat exchanging body; and the heat-dissipating module further has multiple springs respectively mounted in the recesses and each spring surrounding a corresponding second screw.

5. The compliant chuck as claimed in claim 1, wherein
the first tube hole of the base body connects to a first faucet connected to an end of a tube;

the second tube hole connects to a second faucet connected to another end of the tube;

the bottom bracket assembly further has a washer mounted around the center opening of the bracket body; and the protrusion of contact plate further has a side groove formed on a sidewall of the protrusion and receive a second O-shaped ring.

6. The compliant chuck as claimed in claim 2, wherein
the first tube hole of the base body connects to a first faucet connected to an end of a tube;

the second tube hole connects to a second faucet connected to another end of the tube;

the bottom bracket assembly further has a washer mounted around the center opening of the bracket body; and the protrusion of contact plate further has a side groove formed on a sidewall of the protrusion and receive a second O-shaped ring.

7. The compliant chuck as claimed in claim 1, wherein the heat-dissipating module further has
a heat dissipating plate attached to a top side of the thermoelectric cooling module and having multiple posts arranged in a group; and
a third O-shaped ring mounted around the group of the posts.

8. A chiller for the compliant chuck as claimed in anyone of claims 1 to 7 comprising:
two pipes respectively having
a first end connected to a corresponding faucet of the heat exchanging body; and
a second end; and
a cooling device having
a water tank storing cooling water and having an outlet connected to the second end of one of the pipes; and
a pump connected to the water tank and having an inlet connected to the second end of the other one of the pipes.

* * * * *